United States Patent [19]

Gillery

[11] Patent Number: 4,847,158

[45] Date of Patent: Jul. 11, 1989

[54] LOW REFLECTANCE BRONZE COATING

[75] Inventor: Frank H. Gillery, Allison Park, Pa.

[73] Assignee: PPG Industries, Inc., Pittsburgh, Pa.

[21] Appl. No.: 50,825

[22] Filed: May 15, 1987

[51] Int. Cl.$^4$ ............................................... B32B 15/04
[52] U.S. Cl. ..................................... 428/433; 428/432
[58] Field of Search ............... 428/434, 621, 627, 632, 428/672, 651, 433, 432

[56] References Cited

U.S. PATENT DOCUMENTS

| 4,022,947 | 5/1977 | Grubb et al. | 428/432 |
| 4,512,863 | 4/1985 | Criss et al. | 204/192 |
| 4,594,137 | 6/1986 | Gillery et al. | 204/192 |

Primary Examiner—Nancy A. B. Swisher
Attorney, Agent, or Firm—Donna L. Seidel

[57] ABSTRACT

A transparent article for reflecting solar energy comprising a metal alloy oxide film which exhibits color and a low reflectance metal alloy film is disclosed along with a sputtering method for its production.

9 Claims, No Drawings

LOW REFLECTANCE BRONZE COATING

BACKGROUND OF THE INVENTION

The present invention relates generally to the art of transparent coatings and more particularly to multiple layer colored transparent coatings, especially for use on architectural glass products.

Architectural glass products with metallic and/or metal oxide films are growing in importance as energy demands for heating and cooling become increasingly expensive. Coated glass architectural products generally fall into two categories, solar energy control and high transmittance, low emissivity coated products.

Solar energy control glass products are generally glass substrates, often tinted, coated with a high reflectance, low visible transmittance colored film which reduces solar energy transmittance through the windows into the building interior, thereby reducing air conditioning costs. These products are most effective in warm climates and are most often seen in commercial construction. In areas where heating costs are of greater concern, and particularly in residential construction, high transmittance, low emissivity coatings are desirable in order to allow high transmittance of visible light into the interior while reflecting infrared radiation to retain heat inside the building. High transmittance, low emissivity coatings are typically multiple layer films wherein an infrared reflecting metal such as silver, gold or copper is sandwiched between anti-reflective metal oxide layers such as bismuth, indium and/or tin oxides. Solar energy control films, on the other hand, are typically high reflectance single layer films of one or more of the metals or oxides of metals such as cobalt, iron, chromium, nickel, copper, etc.

Wet chemical methods for producing metallic films for solar energy control are well known from U.S. Pats. Nos. 3,846,152; 4,091,172; 3,723,158 and 3,457,138. Pyrolytic methods for producing metal oxide films for solar energy control are well known from U.S. Pats. Nos. 3,660,061; 3.658,568; 3,978,272 and 4,100,330.

Sputtering technologies for producing high transmittance, low emissivity multiple layer coatings are disclosed in U.S. Pat. Nos. 4,462,884 and 4,508,789. Sputtering techniques for producing solar control films are disclosed in U.S. Pat. Nos. 4,512,863 and 4,594,137.

U.S. Pat. No. 4,022,947 to Grubb et al discloses a transparent panel capable of transmitting a desired portion of visible radiation while reflecting a large portion of incident solar radiation, and a method of preparing same, by sputtering an iron, nickel and chromium alloy to obtain a transparent metal film and reactively sputtering the same or a similar alloy in the presence of oxygen to form an oxide film. In one preferred embodiment, the metal film lies between the substrate and the metal oxide film. In another preferred embodiment, the metal oxide film lies between the substrate and the metal film.

U.S. application Ser. No. 682,136 filed Dec. 17, 1984 by R. C. Criss entitled, "Architectural Coating with Interference Colors" discloses intensely colored coatings comprising a layer of highly reflective metal in combination with a layer of a metal compound which exhibits color by both absorption and interference effects.

SUMMARY OF THE INVENTION

The present invention involves a low reflectance, low transmittance, bronze colored solar energy control film deposited on a substrate such as glass by cathode sputtering, preferably magnetron sputtering. The film comprises a layer of a low reflectance colored metal alloy oxide and a layer of a neutral metal alloy. The metal alloy oxide layer provides color and low reflectance while the metal alloy layer provides neutral low transmittance.

DESCRIPTION OF THE PREFERRED EMBODIMENT

A transparent substrate, preferably glass, is coated by cathode sputtering, preferably magnetron sputtering, to provide a solar energy control product. The coating comprises at least one layer of a colored metal alloy oxide, such as stainless steel oxide, and at least one layer of a metal alloy which provides a neutral low transmittance, such as nickel alloys. A preferred metal alloy is Inconel.

In a preferred embodiment of the present invention, a glass surface is first coated with a layer of stainless steel oxide by sputtering a stainless steel cathode target in an oxidizing reactive atmosphere. The stainless steel oxide coated surface is then further coated with a layer of neutral metal alloy by sputtering a nickel alloy target in a nonreactive atmosphere such as argon. The relative thicknesses of the coating layers can be varied to yield a variety of visual effects. In particular, the thickness of the neutral metal layer can be varied to increase or decrease the transmittance without substantially altering the color or the reflectance from the glass side.

In a most preferred embodiment, stainless steel oxide and Inconel metal alloy layers are combined to produce a bronze colored coating. The present invention will be further understood from the description of a specific example which follows.

EXAMPLE I

A multiple layer coating of stainless steel oxide and nickel metal alloy is deposited on a glass substrate under the following conditions, in one pass under multiple cathodes in sequence. A clean glass substrate is maintained in a vacuum chamber in an atmosphere of 50 percent oxygen and 50 percent argon at a pressure of 3 millitorr. A stainless steel cathode with a target surface area measuring 106 by 15 inches (about 2.74 by 0.4 meters) powered at 98 kilowatts. At a line speed of 93 inches (2.36 meters) per minute, a stainless steel oxide coating is deposited at a thickness which decreases the transmittance from 90 percent for the ¼ inch (about 6 millimeter) thick clear float glass substrate to 59 percent. The stainless steel composition used in this example is the 316 alloy, which comprises 68 percent iron, 17 percent chromium, 12 percent nickel and 2.25 percent molybdenum. Next, a nickel alloy cathode is sputtered in an inert argon atmosphere at 3 millitorr. With the same line speed and a power of 7 kilowatts, a nickel alloy coating is deposited over the stainless steel oxide coating further decreasing the transmittance to 16.8 percent. The nickel alloy used in this example is Ioconel 625 which comprises 62.6 percent nickel, 20 percent chromium, 6.85 percent iron and 3.95 percent columbium, plus tantalum, carbon, manganese, iron, sulfur, silicon, copper, aluminum and titanium in trace amounts (less than one percent). When the coated article is exposed to ambient conditions, the nickel alloy coating surface oxidizes slightly increasing the transmittance. The coated article has a low reflectance, bronze colored appearance from the glass side. The luminous transmittance is about 20 percent and the luminous reflectance of the coated article is about 14 percent from the glass side. The reflected color is bronze, having chromaticity coordinates of $x=0.3518$ and $y=0.3518$.

The above example is offered only to illustrate the present invention. Various other colored metal alloy oxides may be used, along with other neutral, low reflectance metals such as chromium alloys. Any suitable transparent protective substrate may be employed. The scope of the present invention is defined by the following claims.

I claim:

1. An article of manufacture for the reflectance of solar energy comprising:
    a. a transparent substrate;
    b. a transparent film of a metal alloy oxide at a thickness which exhibits color deposited on a surface of said substrate; and
    c. a neutral low reflectance transparent metal alloy film deposited on said metal oxide film said films in combination providing a coated article with low transmittance and low reflectance.
2. An article of manufacture according to claim 1, wherein the substrate is glass.
3. An article of manufacture according to claim 2, wherein the low reflectance metal alloy film comprises an alloy of a metal selected from the group consisting of nickel and chromium.
4. An article of manufacture for the reflectance of solar energy comprisng:
    a. a transparent substrate;
    b. a transparent film of an iron alloy oxide at a thickness which exhibits color; and
    c. a transparent, low reflectance, neutral low transmittance nickel alloy film.
5. An article according to claim 4, wherein said nickel alloy comprises nickel, chromium, and iron.
6. An article according to claim 4, wherein said iron alloy oxide film comprises stainless steel oxide.
7. An article according to claim 6, wherein the stainless steel comprises iron, chromium, nickel and molybdenum.
8. An article according to claim 7, wherein said article exhibits a bronze color in reflectance from the glass surface.
9. An article according to claim 1, wherein said transparent films of metal alloy oxide and low reflectance metal are sputtered films.

* * * * *

UNITED STATES PATENT AND TRADEMARK OFFICE
CERTIFICATE OF CORRECTION

PATENT NO. : 4,847,158
DATED : July 11, 1989
INVENTOR(S) : Frank Howard Gillery

It is certified that error appears in the above-identified patent and that said Letters Patent is hereby corrected as shown below:

Column 4, line 6, "comprisng" should be "comprising".

Column 4, line 19, Claim 8 should be dependent on claim 6 instead of claim 7.

Signed and Sealed this

Twelfth Day of June, 1990

Attest:

HARRY F. MANBECK, JR.

*Attesting Officer*     *Commissioner of Patents and Trademarks*